United States Patent [19]
Shibata et al.

[11] Patent Number: 5,454,347
[45] Date of Patent: Oct. 3, 1995

[54] LASER-BEAM ANNEALING APPARATUS

[75] Inventors: Hajime Shibata, Tsukuba; Yunosuke Makita, Toride; Kawakatsu Yamada, Tsukuba; Yutaka Uchida, Kamakura; Saburoh Satoh, Yokohama, all of Japan

[73] Assignee: Agency of Industrial Science & Technology, Ministry of International Trade & Industry, Tokyo, Japan

[21] Appl. No.: 85,048

[22] Filed: Jul. 2, 1993

[30] Foreign Application Priority Data

Jul. 3, 1992 [JP] Japan ..................... 4-176738

[51] Int. Cl.⁶ ................................... C30B 1/02
[52] U.S. Cl. .................. 117/202; 117/10; 117/204; 117/904
[58] Field of Search ............... 117/904, 10, 202, 117/204; 372/20, 25, 29, 30

[56] References Cited

U.S. PATENT DOCUMENTS

| | | | |
|---|---|---|---|
| 4,493,085 | 1/1985 | Valley | 372/24 |
| 4,926,428 | 5/1990 | Kajiyama et al. | 372/24 |
| 4,940,505 | 7/1990 | Schachameyer et al. | 117/904 |
| 4,991,178 | 2/1991 | Wani et al. | 372/32 |
| 5,105,428 | 4/1992 | Pocholle et al. | 372/30 |
| 5,122,223 | 6/1992 | Geis et al. | 117/904 |

*Primary Examiner*—Robert Kunemund
*Attorney, Agent, or Firm*—Oblon, Spivak, McClelland, Maier & Neustadt

[57] ABSTRACT

A laser-beam annealing apparatus that provides reliable, continuous control of the intensity of the laser beam used to perform the annealing process.

6 Claims, 1 Drawing Sheet

LASER-BEAM ANNEALING APPARATUS

BACKGROUND OF THE INVENTION

1. Field of the Invention

This invention relates to an apparatus that performs annealing by means of a laser beam.

2. Description of the Related Art

When a workpiece such as a semiconductor substrate, for example, is subjected to ion implantation, the disturbing impact of the ions during the implantation process causes the crystalline structure of the surface to undergo a transformation to an amorphous state. Following such ion implantation, therefore, annealing is applied to recrystallize the surface. This annealing is performed by irradiating the surface with a laser beam, with the annealing effect being provided by the optical energy of the laser beam being absorbed as heat energy.

If the laser beam used to irradiate the semiconductor substrate has a low energy level, annealing will not take place, while a laser beam that has too high an energy level will cause ablation of the substrate surface, also thereby preventing the annealing from taking place. For the annealing, therefore, the intensity of the laser beam has to be set at an optimum level.

In conventional systems this optimization of the intensity of the laser beam is achieved in a number of ways. In accordance with a first method, for example, the intensity of the laser beam is controlled by controlling the input to the laser oscillator that generates the laser beam. In a second method, the intensity of the irradiating laser beam is controlled by being passed through a filter that has been added to the optical system. In a third method in which annealing is performed by subjecting the semiconductor substrate to large numbers of low energy laser pulses, the irradiating intensity of the laser beam on the semiconductor substrate is controlled by controlling the number of pulses.

However, in the case of the first method, when there is a wide variation in the range of the controlled input to the laser oscillator, the characteristics of the laser oscillator itself are affected, leading to unstable operation. In the case of the second method, the laser beam intensity that is obtained is determined by the filter used, but continuous control of the irradiation intensity of the laser beam is not always possible. Moreover, when the laser has a short wavelength, such as the 157 nm wavelength of an $F_2$ laser, degradation of the filter can change the transmission factor. While it may be possible to obtain a filter that maintains its performance over an extended period, such filters are extremely costly. In the case of the third method, when the semiconductor substrate is annealed by irradiating it with a large number of laser pulses, the increased length of time thereby required for the annealing process means a corresponding decrease in productivity.

Thus, in carrying out the annealing process in accordance with the prior art, it is not always possible to provide reliable, continuous control of the intensity of the annealing laser beam.

OBJECT AND SUMMARY OF THE INVENTION

An object of the present invention is therefore to provide a laser-beam annealing apparatus that is able to provide reliable, continuous control of the intensity of the laser beam used to perform the annealing process.

In accordance with the present invention, this object is attained by a laser-beam annealing apparatus comprising a laser oscillator, a chamber in which is placed a workpiece to be annealed by a laser beam output from the laser oscillator, an optical waveguide that guides the laser beam from the laser oscillator to the chamber, gas supply means that supplies the waveguide with a gas that has a prescribed absorption factor with respect to the laser beam, a detection sensor that detects the concentration of the gas in the waveguide, and control means that in accordance with a detection signal from the detection sensor controls the gas supply means and sets the concentration of the gas in the waveguide.

In accordance with the arrangement of the above laser-beam annealing apparatus, the intensity of the laser beam used to irradiate a workpiece can be adjusted by supplying the waveguide through which the laser beam passes with a gas that has a prescribed absorption factor with respect to the laser beam, and controlling the concentration of the gas, thereby providing the laser beam with an optimum intensity for annealing the workpiece.

Further features of the invention, its nature and various advantages will be more apparent from the accompanying drawing and following detailed description of the invention.

DESCRIPTION OF THE PREFERRED EMBODIMENT

Figure 1:
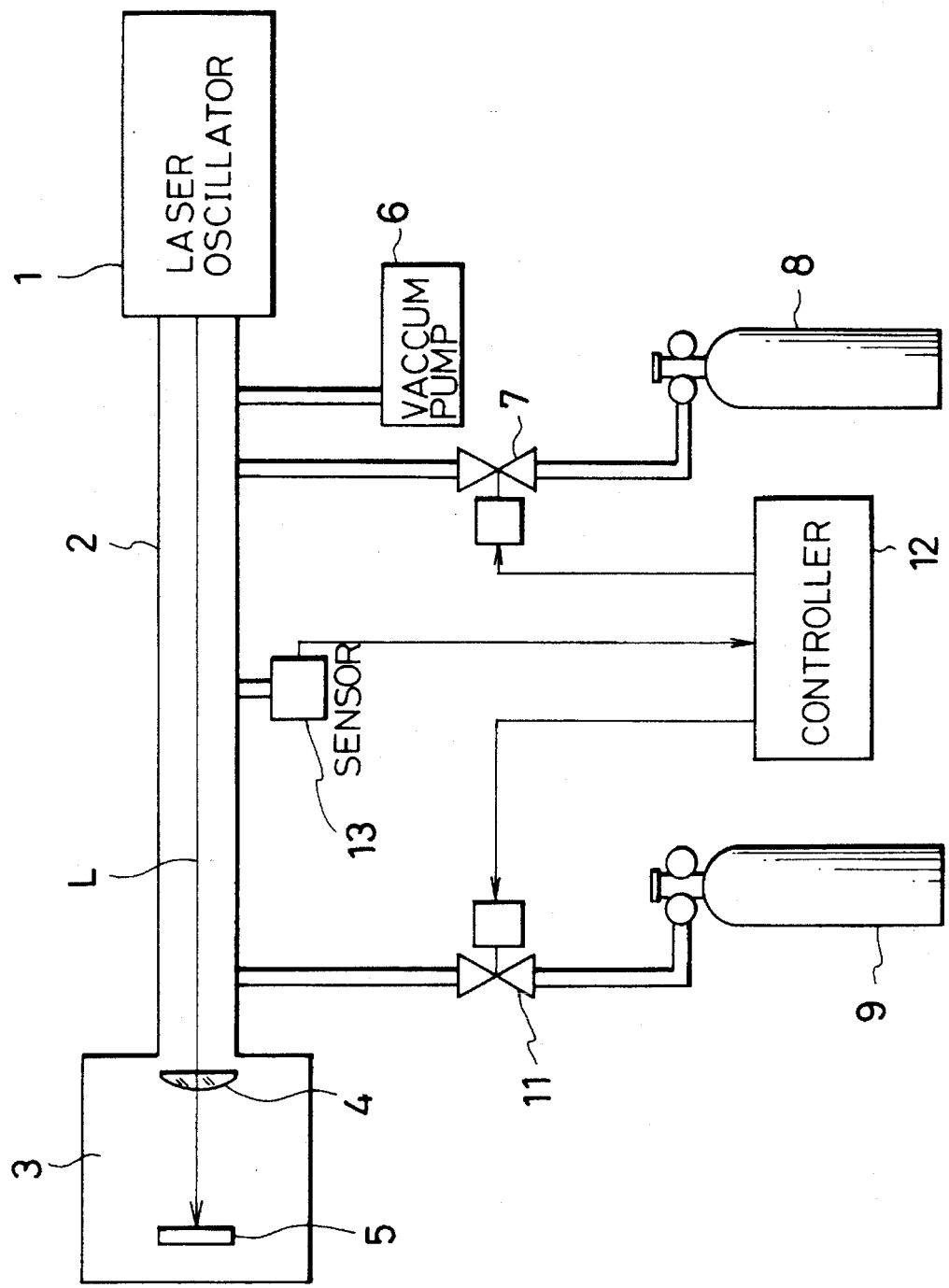
FIG. 1 shows the arrangement of an embodiment of the laser-beam annealing apparatus according to this invention.

An embodiment of the present invention will now be described with reference to the drawing, which shows a laser-beam annealing apparatus provided with an $F_2$ laser or other such laser oscillator 1. The output side of the laser oscillator 1 is hermetically connected with a waveguide 2, and the other end of the waveguide 2 communicates with a chamber 3, whereby a laser beam L output by the laser oscillator 1 passes through the waveguide 2 and is projected into the chamber 3. The chamber 3 is provided with an optical system 4 constituted by a condenser lens that focuses the laser beam L projected into the chamber 3. The arrangement is such that the laser beam L focused by the optical system 4 irradiates a workpiece such as, for example, a semiconductor substrate 5 positioned in the chamber 3.

The waveguide 2 is connected near one end thereof to a vacuum pump 6, and, via a first control valve 7, to a purge gas cylinder 8. The vacuum pump 6 is arranged to reduce the pressure in the waveguide 2 and in the chamber 3 with which the waveguide 2 communicates. The purge gas cylinder 8 supplies gas for purging the waveguide 2 and chamber 3 in which the pressure has been reduced by the vacuum pump 6. The gas used for this purging is an inert one that does not absorb the laser beam L and does not chemically react with the semiconductor substrate 5 heated by the laser beam L, such as for example argon or nitrogen, when an $F_2$ laser is used for the laser oscillator 1.

Near its other end, the waveguide 2 is connected to a control gas cylinder 9 via a second control valve 11. This control gas cylinder 9 is used to supply the waveguide 2 and chamber 3 with a control gas such as oxygen that has a prescribed absorption factor with respect to the laser beam L. The operation of the first control valve 7 and second control valve 11 is controlled by control signals from a controller 12. More specifically, in accordance with signals from the controller 12, the first control valve 7 is either opened or closed, and the opening of the second control valve 11 is proportionally controlled.

The waveguide 2 is provided with a sensor 13 for detecting the concentration of the control gas supplied to the waveguide 2 from the control gas cylinder 9. Detection signals output by the sensor 13 are input to the controller 12. Based on these detection signals, the controller 12 controls the opening of the second control valve 11. The controller 12 has preset values against which the detection signals are compared, with the opening of the second control valve 11 being controlled in accordance with the result of this comparison. The sensor 13 may be a vacuum gauge, such as for example the "Barapton" (product name) of MKS Instrument Inc. of the U.S.

Oxygen can be used as the control gas supplied to the waveguide 2, because, in a vacuum, oxygen exhibits strong Schumann-Runge series absorption in the ultraviolet region. With an $F_2$ laser oscillator 1 that generates a laser beam L with a wavelength of 157 nm, the absorption is 0.125 $cm^{-1}atm^{-2}$. In the case of an $F_2$ laser, therefore, if there is air in the waveguide 2, the light absorption by the oxygen in the air will degrade the output power of the laser impinging on the semiconductor substrate 5. For this reason, usually air in the waveguide 2 is pumped out, and the waveguide 2 is then filled with argon, nitrogen or other such inert gas which will not absorb the laser beam L emitted by an $F_2$ laser.

If the concentration of the oxygen supplied to the waveguide 2 is suitably adjusted, the absorption factor a at that time is shown as $$a=(1-e^{-0.125 lp})\times 100\% \quad (1)$$

Thus, the control gas supplied to the waveguide 2 functions as a type of filter. In the above equation, l is the length of the light path from the point at which the laser beam L is output from the laser oscillator 1 to the point at which it reaches the semiconductor substrate 5, and p is the differential pressure of the oxygen.

Thus, when for the purpose of obtaining a certain annealing condition it is necessary to reduce the output power of the laser beam L by 50 percent for example, if the length of the light path is one meter, this can be done by adjusting the oxygen concentration in the waveguide 2 to 5.5 percent.

With the laser-beam annealing apparatus thus arranged, the intensity of the laser beam L used to irradiate the semiconductor substrate 5 in the chamber 3 can be controlled by the concentration of the control gas introduced into the waveguide 2. The concentration of control gas in the waveguide 2 is detected by the sensor 13. When detection signals output by the sensor 13 are input to the controller 12, the controller 12 compares these detection signals with values preset in the controller 12 and, based on this comparison, outputs a control signal to the second control valve 11. As a result, the second control valve 11 is adjusted to an opening that corresponds to the preset value, thereby controlling the concentration of the control gas supplied to the waveguide 2. This arrangement therefore allows the laser beam L absorption factor in the waveguide 2 to be varied. Thus, the intensity of the laser beam L output by the laser oscillator 1 to impinge on the semiconductor substrate 5 can be controlled, thereby enabling the annealing conditions of the semiconductor substrate 5 to be adjusted.

By thus controlling the concentration of the control gas in the waveguide 2, if the laser beam L is emitted by the laser oscillator 1 at 100-percent intensity the laser beam L irradiation intensity at the semiconductor substrate 5 can be steplessly varied from zero to 100 percent. This makes it possible to carry out high-precision annealing of the semiconductor substrate 5 by controlling the laser beam L to the optimum intensity.

Moreover, as the laser oscillator 1 can be constantly operated under optimum conditions, variation in the intensity of the laser beam L output by the laser oscillator 1 is eliminated, allowing the semiconductor substrate 5 to be annealed under a constant set of annealing conditions.

Concerning the annealing process, first the vacuum pump 6 is used to reduce the internal pressure in the waveguide 2 and chamber 3. Following this, the first control valve 7 is opened to allow air inside the waveguide 2 and chamber 3 to be replaced by purge gas, and control gas is then supplied to achieve a prescribed concentration, after which the annealing is performed.

The invention is not limited to the embodiment described above, and may be modified in various ways without departing from the scope of the invention. For example, although the above embodiment relates to the use of oxygen as the control gas for absorbing the laser beam, other substances may be used having a prescribed absorption factor relative to the laser beam output by the laser oscillator, such as for example ammonia gas or methane gas. Also, the vacuum pump 6, purge gas cylinder 8, control gas cylinder 9 and sensor 13 may be connected to the chamber 3 instead of to the waveguide 2.

What is claimed is:

1. A laser-beam annealing apparatus, comprising:

a laser oscillator generating oscillating ultraviolet rays in a vacuum;

a chamber in which is placed a workpiece to be annealed by a laser beam output from the laser oscillator;

an optical waveguide that guides the laser beam from the laser oscillator to the chamber;

gas supply means that supplies the waveguide with a gas having a prescribed absorption factor with respect to the laser beam;

a detection sensor that detects the concentration of gas in the waveguide; and control means that, in accordance with a detection signal from the detection sensor, controls the gas supply means to set the concentration of the gas in the waveguide.

2. A laser-beam annealing apparatus according to claim 1, wherein the laser oscillator is an $F_2$ laser.

3. A laser-beam annealing apparatus according to claim 1, wherein the gas having a prescribed absorption factor is oxygen.

4. A laser-beam annealing apparatus according to claim 1, further comprising a vacuum pump for reducing internal pressure in the waveguide and chamber.

5. The laser beam annealing apparatus according to claim 1, wherein:

the gas supplied to the waveguide exhibits strong Schumann-Runge series absorption in the ultraviolet region; and said control means sets the concentration of said gas selectively to vary the absorptivity of said gas in the ultraviolet region which varies an intensity of the laser beam passing through said gas in said waveguide.

6. The laser-beam annealing apparatus of claim 1, wherein:

said gas is selected based on an absorptivity a which satisfies the relation:

$$a=(1-e^{-0.125 lp})\times 100\%$$

wherein p is a differential pressure of the gas and l is a length of a light path of the laser beam to the workpiece.

* * * * *